United States Patent
Chandrasekaran et al.

(10) Patent No.: US 9,742,398 B2
(45) Date of Patent: Aug. 22, 2017

(54) METHODS AND APPARATUS FOR SENSING CURRENT THROUGH POWER SEMICONDUCTOR DEVICES WITH REDUCED SENSITIVITY TO TEMPERATURE AND PROCESS VARIATIONS

(71) Applicant: Texas Instruments Incorporated, Dallas, TX (US)

(72) Inventors: Ramesh Chandrasekaran, Plano, TX (US); Cetin Kaya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/994,560

(22) Filed: Jan. 13, 2016

(65) Prior Publication Data

US 2017/0201251 A1    Jul. 13, 2017

(51) Int. Cl.
*H03K 17/687* (2006.01)
(52) U.S. Cl.
CPC ............... *H03K 17/6871* (2013.01)
(58) Field of Classification Search
CPC ................................. H03K 17/6871
USPC ...................................... 327/434
See application file for complete search history.

(56) References Cited

U.S. PATENT DOCUMENTS

| | | |
|---|---|---|
| 5,006,733 A | 4/1991 | Brown |
| 5,666,046 A | 9/1997 | Mietus |
| 5,966,024 A | 10/1999 | Bui et al. |
| 5,982,160 A | 11/1999 | Walters et al. |
| 6,160,441 A | 12/2000 | Stratakos et al. |
| 6,445,244 B1 | 9/2002 | Stratakos et al. |
| 6,812,677 B2 | 11/2004 | Walters et al. |

(Continued)

FOREIGN PATENT DOCUMENTS

JP    2015025667 A   *   2/2015

OTHER PUBLICATIONS

Bob Mammano, "Current Sensing Solutions for Power Supply Designers," 1997, Unitrode, retrieved on the World Wide Web on Jan. 13, 2016: http://www.smps.us/Unitrode.html.

(Continued)

*Primary Examiner* — Lincoln Donovan
*Assistant Examiner* — Metasebia Retebo
(74) *Attorney, Agent, or Firm* — William B. Kempler; Charles A. Brill; Frank D. Cimino

(57) ABSTRACT

Current sensing through a power semiconductor device with reduced sensitivity to temperature and process variations. An example arrangement includes a power switch coupled between a voltage input and an output voltage terminal supplying current to a load; a first isolation switch coupled between the voltage input and a first node; a comparator amplifier having a pair of differential inputs coupled to the first node and a second node outputting a voltage in response to the difference at the differential inputs; and a first current source coupled between a positive supply voltage and the first node to output a first current responsive to the voltage output from the comparator amplifier; wherein the first current is proportional to the current through the power switch and a ratio of the on resistance of the power switch and the on resistance of the first isolation switch. Methods and additional arrangements are also disclosed.

17 Claims, 8 Drawing Sheets

(56) References Cited

U.S. PATENT DOCUMENTS

| | | |
|---|---|---|
| 6,833,690 B2 | 12/2004 | Walters et al. |
| 6,870,352 B2 | 3/2005 | Walters et al. |
| 7,408,388 B2 | 8/2008 | Nagasawa et al. |
| 7,557,557 B2 * | 7/2009 | Sugie .................... G11B 19/28 323/277 |
| RE42,307 E | 4/2011 | Walters et al. |
| 8,143,870 B2 | 3/2012 | Ng et al. |
| 8,314,606 B2 | 11/2012 | Sato et al. |
| 2006/0232266 A1 | 10/2006 | Kelly |
| 2016/0161529 A1 * | 6/2016 | Hirano ................ G01R 15/148 324/252 |

OTHER PUBLICATIONS

International Rectifier, "SOT-23 Current Sensing IC," Data Sheet: IR25750LPBF, Jan. 15, 2015, www.irf.com.

* cited by examiner

METHODS AND APPARATUS FOR SENSING CURRENT THROUGH POWER SEMICONDUCTOR DEVICES WITH REDUCED SENSITIVITY TO TEMPERATURE AND PROCESS VARIATIONS

TECHNICAL FIELD

The present application relates in general to the field of electronic circuits, and in particular to a method and circuitry for a sensing load currents over a wide temperature range in power semiconductor devices.

BACKGROUND

Field Effect Transistors (FETs) have been a staple for low resistance electronic switches since their introduction to the market. In a common application a power FET or switch that is implemented using a FET is used to couple a supply voltage to a load at an output voltage terminal. Measuring the current flow through a FET is a common requirement by control circuits designed to keep the system (of which the FET and the control circuits are a part of) within its operational parameters, as well as especially as a safety to effect current limiting during high load conditions to prevent device damage or failure of the FET. The maximum current flow occurs in the conduction mode when the FET is on and the resistance between the drain and source ($R_{DS}$on) is low. Traditional current sensing methods of adding a series resistor in the current path can generate a current measurement point, however this approach poses a tradeoff between power dissipation and peak measurement voltage. The series resistor value must be large enough for the sensed signal (a voltage corresponding to current through the resistor is measured) to be above the signal noise floor, yet as small as possible to reduce power dissipation. In addition, the power dissipation of the shunt resistor will be proportional to the square of the load current, hence negatively effecting the efficiency of the system. Furthermore, the parasitic inductance of such series resistance elements play an important detrimental role in determining circuit behavior when switching large currents in short time, causing voltage overshoots that overstress the circuits. Another known prior method is to use the voltage across parasitic resistance of an inductor, which is a part of the load, to approximate the load current.

FIG. 1 illustrates in a circuit diagram 100 another prior art circuit for estimating load current from a power FET. In FIG. 1, an example circuit 100 from U.S. Pat. No. 5,982,160 to Walters et al. is presented where the load current is approximated by reconstructing the voltage from a series inductor 110 across a resistor-capacitor (RC) network 120. The inductor 110 variation, which is attributed to the mechanical amount of wire used and the intrinsic temperature sensitivity, will have a noticeable effect on the sensing accuracy across a wide temperature range. In further work, as illustrated in FIG. 1 of U.S. Pat. No. 6,870,352 by Walters et. al., a temperature compensated resistor was used in the RC network 120 to help contain the temperature variance issue. Using such temperature compensated resistors is typically considerably more expensive than resistors integrated within the semiconductor package.

In the conduction mode, a FET has a somewhat linear $R_{DS}$on which entices one to sense the voltage across the FET and use the appropriate $R_{DS}$on value to estimate the approximate load current. However, the resistance $R_{DS}$on could have a thermal coefficient as large as 8000 ppm/° C., equaling about 80% in a typical operating range of 25° C. to 125° C. To combat the large variance due to thermal changes, various arrangements of components with matching thermal coefficients (TC) have been employed to counteract the variations due to the intrinsic TC of the power FET.

FIG. 2 illustrates in another circuit diagram 200 another prior art solution for temperature compensated load current sensing. In FIG. 2, a schematic taken from FIG. 2 of U.S. Pat. No. 6,870,352 by Walters et al., shows the use of another thermally compensated sense resistor 220 ($R_{SEN}$) is arranged and substantially matched to the thermal variation of the $R_{DS}$on of power FET 210.

FIG. 3 illustrates another prior art load current sensing arrangement. In 300 a "current branch" methodology is employed to estimate the load current. The primary power FET 310 is switched by a PWM switching arrangement and as the load current flows through the load, part of the current is diverted to the sensing FET 330. Sense FET 330 is a smaller FET with a higher on resistance than the power FET 310. A sample of the load current will create a voltage Vs across resistor Rs that is proportional to the load current. Use of the sense FET 330 provides a simple method to approximate the load current, however it has a few drawbacks. Of concern is the achievable current accuracy and noise tolerance, which is limited by the voltage developed on the resistor. This also trades off with the ability to match the drain to source voltage of the two FETS; a mismatch is translated to nonlinearity in the current measurement. In addition, since the voltage across the resistor Rs is small in comparison to other methods, amplifier 332 is typically required to drive external (to the IC) loads, posing tradeoffs on the circuit response speed, range and accuracy.

In each of the prior solutions, temperature compensated resistors are needed with the best match available at the time of manufacture. These temperature compensated resistors are provided external to the integrated circuit of the FETs, and are quite expensive. Accordingly additional solutions have been attempted to exclude them.

FIG. 4 illustrates in another circuit schematic 400 an additional prior art current sensing topology excluding TC matched resistors. In FIG. 4, the power FET 410 is switched by a PWM switching circuit. The load current $I_{LOAD}$ flows through the load 490. Vin is typically a voltage higher than the breakdown voltage of the sensing circuitry. To protect the sensing circuits from the high voltage of Vin, another isolation FET 420 is used to block the high voltage when power FET 410 is in the off condition. When the power FET 410 is switched on, the voltage across it drops to a safe level, at which point the sensing switching circuitry will turn on the isolation FET 420 and turn off the protection FET 430. At this time voltage Vs is proportional to the on resistance $R_{DS}$on of the power FET 410 and the current through it. The circuit has a fast following capability and also a reasonable V to I linearity at a given temperature. In addition, in a typical application, the peak sense voltage Vs could be in the range of 1 volt providing good range, resolution, and noise immunity compared to the few tens of mV in other architectures. Where this prior known arrangement falls short is in its nonlinearity due to temperature dependence of Rdson of FET 410, which can be a large value as was pointed out earlier. Temperature variation, which is also dependent on load applied, will produce a large variation even for a given current through the FET 410. In a complex system, there are methods of calibration to reduce the error, but that process in itself adds unwanted complexity and additional cost.

Continuing improvements are therefore desirable for methods and apparatus to provide current sensing in a power FET over a range of temperatures at a relatively low cost.

SUMMARY

A power FET is switched by a control circuit for implementing systems such as, for example, power management or motor control systems. The power FET supplies current from an input voltage to a load that is coupled to an output terminal. At least a first isolation FET is coupled to the power FET and to a comparator amplifier. At least one current source is also connected to one of the comparator amplifier inputs and supplies a current in response to the output of the comparator, creating a current output that fluctuates with the current in the power FET. The output current is related to the load current by a temperature independent proportion of ratio of the on resistances of the power FET and the at least one isolation FET. Co-locating the isolation FET on the same substrate as the power FET minimizes the differences due to any temperature mismatch. If the isolation FET is, in addition, of the same type as the power FET, mismatch effects due to process variations are also minimized.

In an example arrangement, an apparatus includes a power switch having a switch control input and having a current conduction path coupled between a voltage input and an output voltage terminal, configured for supplying current to a load responsive to a switch control signal coupled to the switch control input; a first isolation switch having a current conduction path coupled between the voltage input a first node, and having a control terminal coupled to an isolation switching control circuit; a comparator amplifier having a pair of differential inputs coupled to the first node and to a second node, and having at least one output, the comparator amplifier configured to output a voltage in response to the difference at the differential inputs; and a first current source coupled between a positive supply voltage and the first node, and configured to output a first current responsive to the voltage output from the comparator amplifier; wherein the first current is proportional to the current through the power switch and to a ratio of the on resistance of the power switch and the on resistance of the first isolation switch.

In a further arrangement, the above apparatus further includes a second isolation switch coupled between the output voltage terminal and the second node; and a second current source coupled between the positive supply voltage and the second node.

In yet another arrangement, in the arrangement above, the comparator amplifier further includes a second output voltage and the second current source supplies a current to the second node responsive to the second output voltage.

In still another arrangement, in the arrangements above a difference between the first current and the second current is proportional to a current supplied through the power switch.

In still another arrangement, in the above apparatus, wherein the power switch, the first isolation switch and the second isolation switch each include a field effect transistor (FET) formed of a common semiconductor material. In yet a further arrangement, in the above apparatus, the semiconductor material includes gallium nitride. In still another alternative arrangement, in the above apparatus, the semiconductor material includes silicon. In another alternative arrangement, in the above apparatus, the semiconductor material is one selected from the group consisting essentially of silicon, silicon carbide, gallium arsenide, gallium nitride, indium arsenide, germanium, and silicon germanium. In yet a further arrangement, in the above apparatus, the power switch, the first isolation switch, and the second isolation switch each consist of GaN FET devices.

In another alternative arrangement, in the above apparatus, the first isolation switch and the second isolation switch includes transistors that are a same size. In still another arrangement, in the above apparatus, the apparatus further includes a second current source coupled between the first node and a negative power supply and supplying a second current from the first node; wherein the second node of the comparator amplifier is coupled to the output voltage terminal, and a difference between the first current and the second current is proportional to the current through the power switch. In yet another alternative arrangement, in the above apparatus, the proportion is equal to a ratio of the on resistance of the power switch and the on resistance of the first isolation switch.

In another example arrangement, a method includes coupling a current conduction path of a power switch between an input voltage terminal and an output voltage terminal for supplying current to a load at the output voltage terminal, responsive to a switching control circuit; coupling a current conduction path of a first isolation switch between the input voltage terminal and a first node, and coupling a first current source between a positive voltage power supply and the first node, the first current source having a control input; coupling a comparator amplifier to the first node and to a second node, and coupling the output of the comparator amplifier to the control input of the first current source; operating the power switch to supply current to a load coupled to the voltage output terminal; operating the comparator to control the first current from the first current source; and using the first current, computing a load current through the power switch.

In a further method arrangement, the above described method further includes coupling a second isolation switch between the voltage output terminal and the second node, and coupling a second current source between the positive voltage supply and the second node; coupling a second output of the comparator amplifier to control a second current supplied by the second current source to the second node; operating the power switch to supply current to a load coupled to the voltage output terminal; operating the comparator to control the first current and the second current; and computing a load current through the power switch by determining a difference between the first current and the second current. In still another example arrangement, the above described method further includes coupling a second current source to the first node to supply a second current from the first node to a negative voltage supply; coupling the output voltage terminal to the second node; operating the power switch to supply current to a load coupled to the output voltage terminal; operating the comparator to control the first current; and computing a load current through the power switch by determining a difference between the first current and the second current. In still a further arrangement, in the above described method, the power switch and the first isolation switch are FET devices formed on a common semiconductor substrate.

In yet another example arrangement, an integrated circuit includes a semiconductor substrate; a power FET formed on the semiconductor substrate and having an input voltage terminal, a gate terminal coupled to a switch control circuit, and an output voltage terminal, the power FET configured to supply current to a load at the voltage output terminal; a first isolation FET formed on the semiconductor substrate and coupled between the input voltage terminal and a first node, and having a gate terminal coupled to an isolation control circuit; a comparator amplifier having a first differential input coupled to the first node and a second differential input, and configured to output a voltage corresponding to a difference between the voltages at the first differential input and the second differential input; and a first current source coupled between a positive voltage supply and the first node, configured to output a current responsive to the output voltage from the comparator amplifier; wherein the current output from the first current source is proportional to the current through the power FET and a ratio of an on resistance of the power FET and an on resistance of the first isolation FET.

In still another arrangement, the integrated circuit above is provided and includes a second isolation FET formed on the semiconductor substrate and coupled between the output voltage terminal and a second node; and a second current source coupled between the positive voltage supply and the second node to supply a second current to the second node; the second node coupled to the second differential input, and the comparator having a second output controlling the second current source; wherein a difference between the first current and the second current is proportional to the current through the power switch multiplied by a ratio of the on resistance of the power FET and an on resistance of the first isolation FET.

In another alternative arrangement, the integrated circuit described above is provided and further includes a second current source coupled between the first node and a negative voltage supply and configured to supply a second current from the first node to the negative voltage supply; and the second differential input is coupled to the output voltage terminal; wherein a the difference between the first current and the second current is proportional to the current through the power FET multiplied by a ratio of the on resistance of the power FET to an on resistance of the first isolation FET.

In yet another further arrangement, in the above described integrated circuit, the semiconductor substrate is one of materials used for power devices, for example silicon, germanium, silicon carbide, gallium arsenide, silicon germanium, and gallium nitride.

Use of the novel arrangements of the present application enable sensing current through a power switch to a load with little temperature dependence.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements that convey the relevant aspects to one skilled in the art and are not necessarily complete implementations.

DETAILED DESCRIPTION

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

In an aspect of the present application, an architecture will be introduced that reduces the temperature dependence current estimation from the drain to source voltage of a power transistor. In addition, the novel architecture and methods minimize effects of temperature and process variations to achieve a more accurate current $I_{SENSE}$ that is stable across a wide temperature range.

Figure 1:
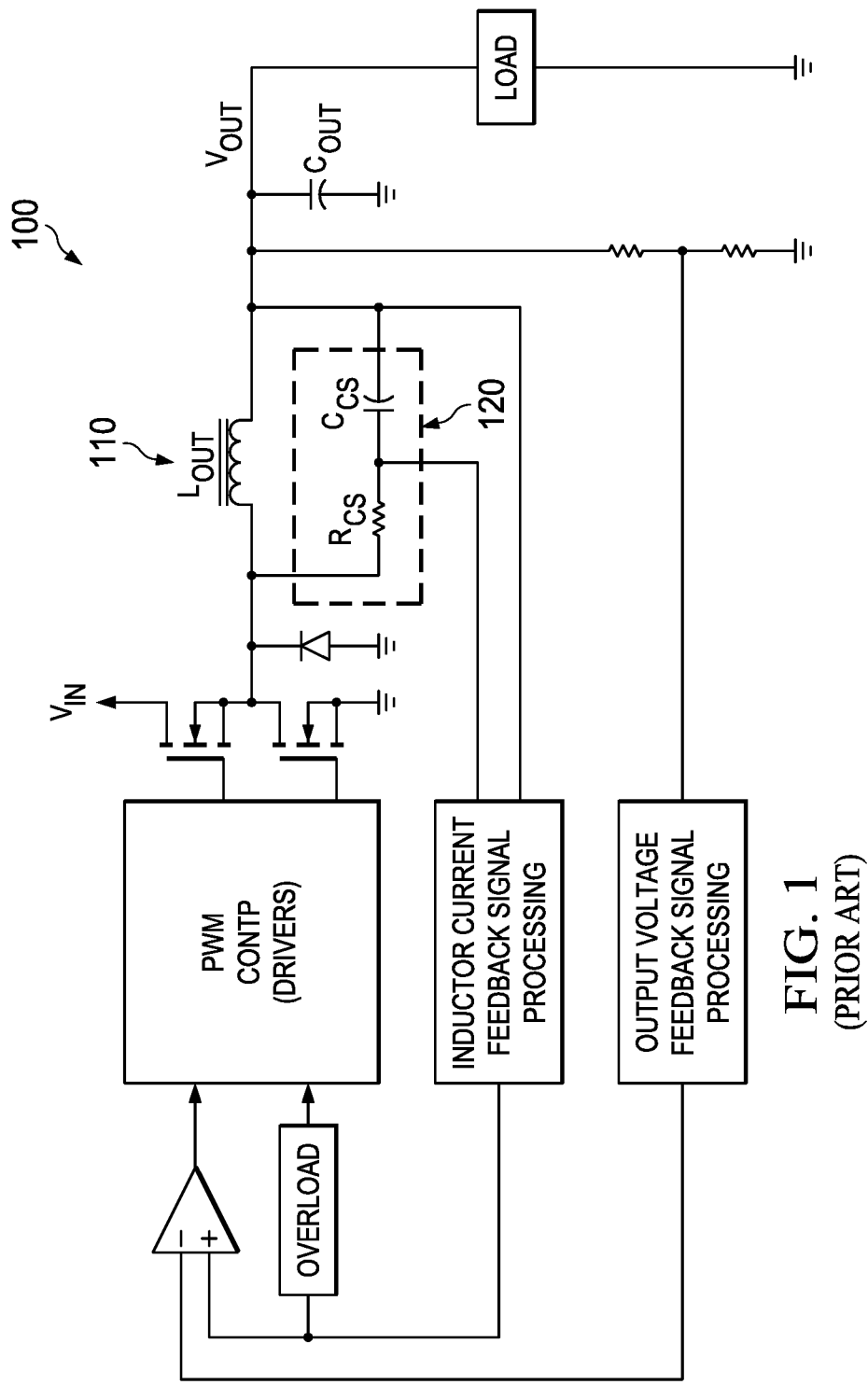
FIG. 1 illustrates in a circuit diagram a prior art circuit for estimating load current from a power FET.
Figure 2:
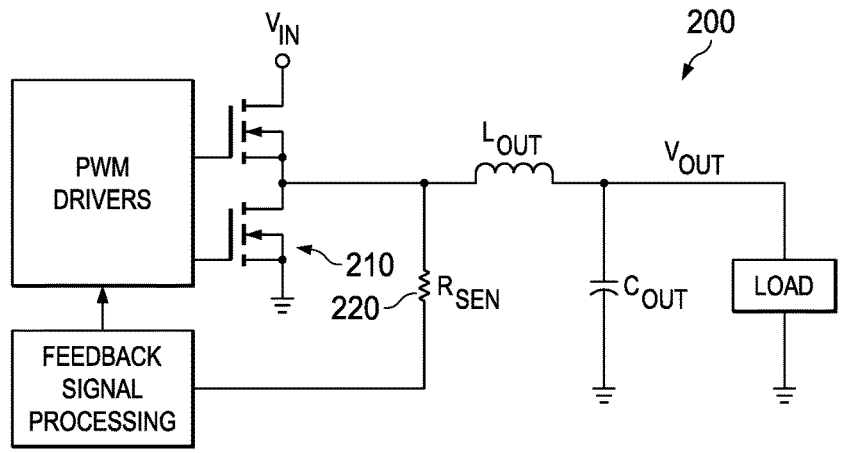
FIG. 2 illustrates in another circuit diagram another prior art solution for temperature compensated load current sensing.
Figure 3:
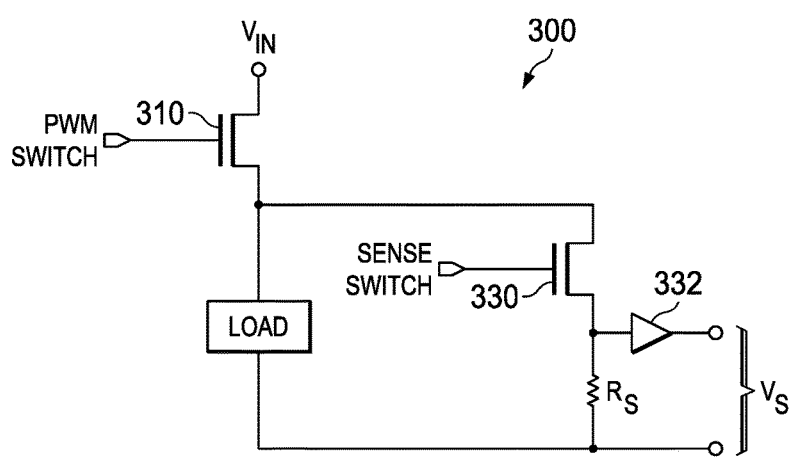
FIG. 3 illustrates in another circuit diagram yet another prior art load current sensing arrangement.
Figure 4:
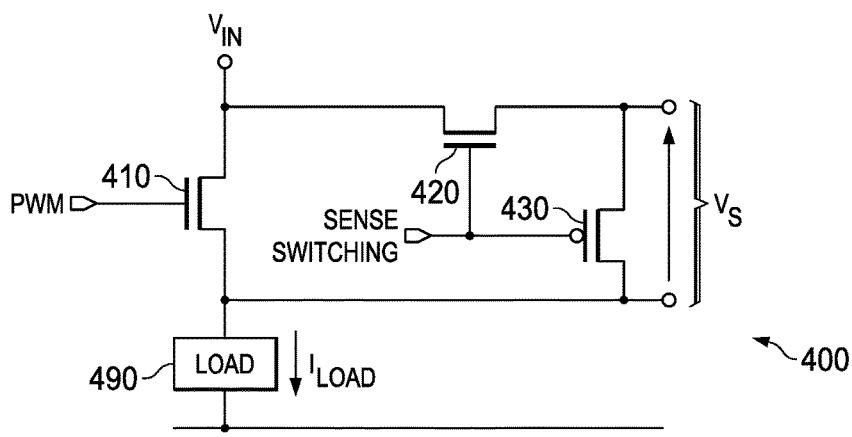
FIG. 4 illustrates in a circuit diagram a prior art current sensing topology.
Figure 5:
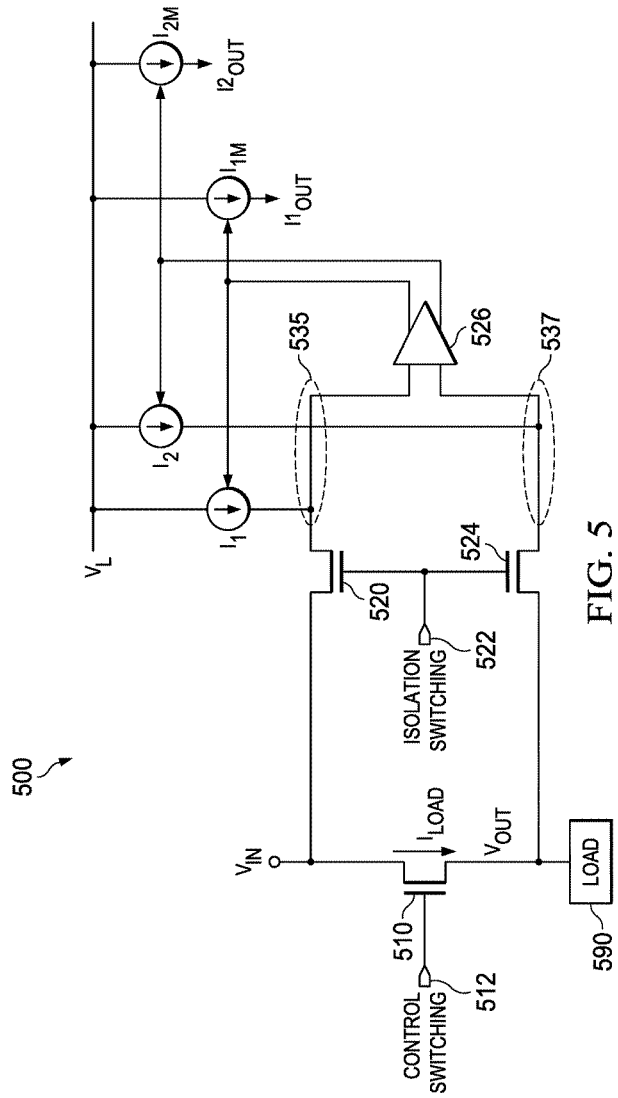
FIG. 5 illustrates in a circuit schematic an example arrangement utilizing an aspect of the present invention.

FIG. 5 illustrates in a circuit schematic 500 an arrangement utilizing an aspect of the present application In FIG. 5, power FET 510 is switched by control switching circuitry 512. Those skilled in the art of power FET switching will appreciate the various forms of construction and operation of the PWM/PFM switching circuitry without further detailed discussion. Power FET 510 is supplied by Vin and provides a load current $I_{LOAD}$ to the load 590 at an output terminal Vout. Coupled to the drain/source terminals of power FET 510 are a pair of isolation FETs 520 and 524. The isolation FETs are switched by the isolation switching circuitry 522, shown as a circuit block. At node 535, isolation FET 520 is coupled to current source I1 which is supplied by a positive voltage supply $V_L$. At node 537, isolation FET 524 is coupled to current source I2 which is also supplied by voltage $V_L$. A comparator amplifier, which can be implemented using a differential operational amplifier (op amp) 526 has its inputs coupled to node 535 and 537. The differential outputs of the op amp 526 are coupled to the control inputs of current sources I1 and I2. Current mirrors for I1 and I2 are coupled by their control and are designated as $I_{1M}$ and $I_{2M}$ and output currents I1out, I2out.

In circuit 500, isolation FETs 520 and 524 are assumed to be of the same size and located on the same substrate. In an example arrangement, circuit 500 can be a single integrated circuit including all of the circuit elements of FIG. 5; however in additional alternative arrangements, the FET devices 510, 520, 524 can be formed on an integrated circuit while other portions of the circuit 500 could be fabricated on a second integrated circuit. In one particular example arrangement, the power FET 510 and the isolation FETs 520 and 524 can be formed from Gallium Nitride (GaN) semiconductor material. In an additional alternative arrangement, the isolation FETs 520, 524 and power FET 510 can be fabricated using silicon carbide (SiC) material. FET devices fabricated from GaN and/or SiC material are increasingly used in power applications because the material provides FETs allowing high-voltage hard-switched and soft switched converters to operate at higher frequencies. The material also provides converters with faster switching speeds and may enable reducing or eliminating heat sinks in some applications. In an example fabrication arrangement, GaN FETs can be formed in a semiconductor substrate implemented as an epitaxial layer of AlGaN material formed over a silicon or other substrate, for example. The present application and the novel arrangements are not limited to a particular semiconductor material, however. For example, the circuit 500 can also be fabricated using FETs manufactured using silicon substrates, or other semiconductor materials and III-V material combinations such as gallium arsenide (GaAs), silicon germanium (SiGe), silicon carbide, germanium or other materials known for use in transistor manufacture. Epitaxial layers can be used to form the semiconductor material for the FET devices. The co-location of the FETs on a single substrate or semiconductor layer normalizes the processing variation as well as the thermal conditions that each of these components experiences regardless of the thermal constant of the device package. Vin is assumed to greater than the breakdown voltage of the sense circuitry so the isolation switching ensures that the isolation FETs are only ON when the power FET 510 is ON. When the power FET is on, the voltage across the power FET's drain-source, $V_{DS}on$, is within the voltage tolerance of the sense circuitry. Those skilled in the art of FET switching will appreciate the various forms of construction and operation of the isolation switching circuitry without further detailed discussion.

Analyzing the voltage Vdson across the power FET 510 yields the following relationships:

$$I_1 \times R_{ON}(520) + V_{DS}on(510) = I_2 \times R_{ON}(524) \quad \text{Equation 1}$$

$$V_{DS}on(510) = I_2 \times R_{ON}(524) - I_1 \times R_{ON}(520) \quad \text{Equation 1.1}$$

Since all the two isolation FETs are the same size and are co-located, $R_{ON}$ can be assumed to be the same for FETs 520 and 524.

And for $I_1, I_2 \ll I_{LOAD}$: $V_{DS}on(510) = R_{DS}on(510) \times I_{LOAD}$, thus:

$$R_{DS}on(510) \times I_{LOAD} = I_2 \times R_{ON} - I_1 \times R_{ON} \quad \text{Equation 1.2}$$

rearranged as:

$$R_{DS}on(510) \times I_{LOAD} = (I_2 - I_1) \times R_{ON} \quad \text{Equation 1.3}$$

Solving for the load current:

$$I_{LOAD} = (I_2 - I_1) \times (R_{ON} \div R_{DS}on) \quad \text{Equation 1.4}$$

Where the sense current $I_{SENSE} = (I_2 - I_1)$ $$I_{LOAD} = I_{SENSE} \times (R_{ON} \div R_{DS}on). \quad \text{Equation 1.5}$$

With the 3 FETs 510, 520 and 524, being co-located on a common semiconductor substrate, the on resistances change factor for the devices should be well matched across the temperature range. The change factor can be expressed as change from a nominal value, Rnom, as follows:

$$R\text{nom} * (1 + TC * (T - T\text{nom})) \quad \text{Equation 1.6}$$

In an example arrangement, the isolation transistors 520, 524 can be the same size as the power FET 510, however, because these isolation transistors are used only as sensing elements, in another example arrangement these transistors will be smaller and perhaps much smaller than the power FET. The ratio of on resistances used in the arrangements divides quantities with an approximately equal or common temperature coefficient. When the ratio is taken as in Equation 1.5, the term $(R_{ON} \div R_{DS}on)$ therefore cancels out the individual temperature coefficients and makes the estimate of the load current through the power FET independent of temperature, and proportional to the difference in the currents $I_2$ and $I_1$. The current mirrors $I_{2M}$ and $I_{1M}$ can be utilized by the circuit designer to output these currents as currents I1out and I2out and then the circuitry can compute the load current and use the $I_{LOAD}$ information as needed. A typical use of the outputs would be to determine the load current and feedback the information to the Control Switching block, so as to limit the amount of load current to a current value the power FET 510 can safely handle. However the arrangements are not limited to this example application, and the current sensed through the FET 510 can be used for other purposes.

Figure 6:
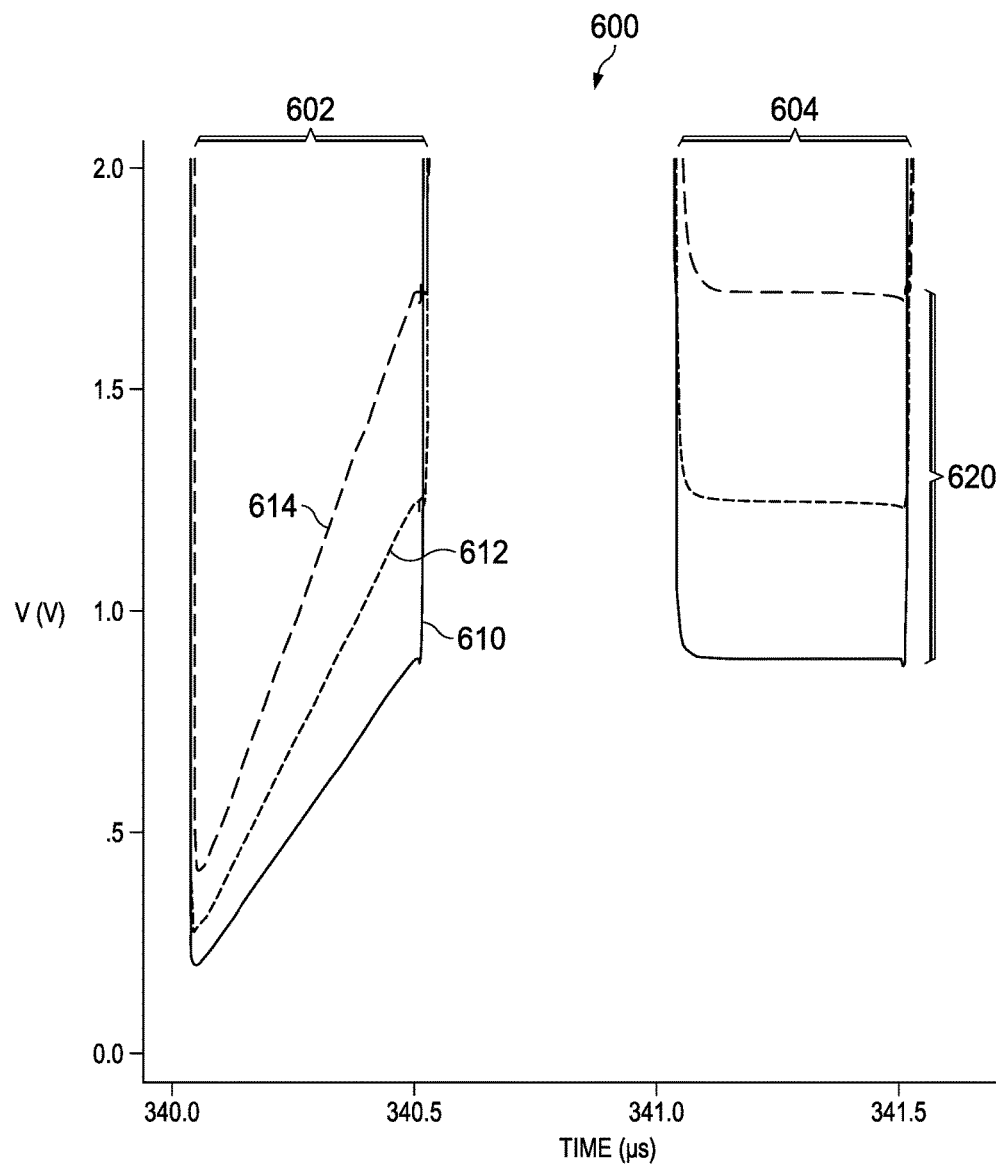
FIG. 6 is a graph of a power FET voltage $V_{DS}$on at 3 temperatures.

FIG. 6 presents a graph 600 of a power FET voltage $V_{DS}on$ at 3 temperatures. Illustrated in FIG. 6 is a graph 600 with the FET voltage $V_{DS}on$ plotted on the vertical axis and time plotted on the horizontal axis. In a simulated test of a power FET 510 such as shown in FIG. 5, two step loads were applied at 3 different temperatures in the time periods designated by 602 and 604. The lowest data line, 610 was simulated at 27 C, the middle line 612 was simulated at 85 C and the top line 614 was simulated at 125 C. Since the FET has a positive TC, it is expected that line 614 will have a higher reading than the room temperature data line 610. The first test load varies across the time span 602 starting approximately at 1.5 A and increasing to 5 A. Looking at the 27 C data line 610, $V_{DS}on$ begins by dropping to approximately 0.2V then steadily rises to approximately 0.9V. The rising $V_{DS}on$ voltage is illustrative of an increasing load current. During the second test, the test load is constant cross the time period 604 at approximately 5 A. Examining the 27 C data line 610, the voltage $V_{DS}on$ is pretty constant at approximately 0.9V. In 604, the high temperature data line 614 is steady at approximately 1.7V. Span 620 illustrates the approximately 90% rise in $V_{DS}on$ over the approximate 100 degrees C. temperature range. This high change in $V_{DS}on$ over temperature illustrates why using the voltage $V_{DS}on$ directly for an estimate of load current in the FET is an unreliable approach.

Figure 7:
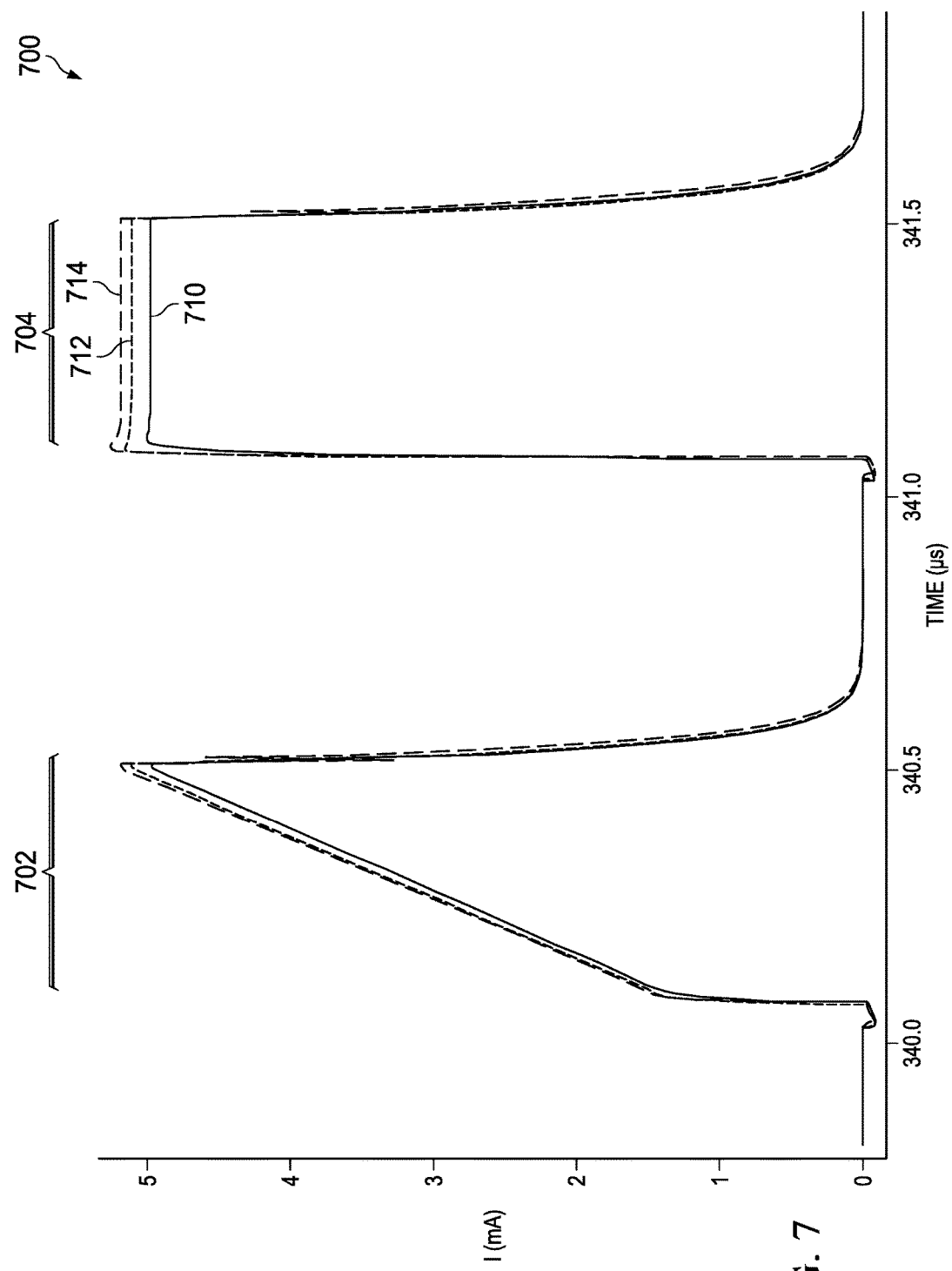
FIG. 7 is a graph illustrating the load current estimate of a power FET obtained using an example arrangement across a temperature range.

FIG. 7 is a graph of the load current estimate obtained using the arrangements for a power FET across a temperature range. In FIG. 7, a graph 700 presents increasing milliamp current on the Y axis and time on the X axis. Graph 700 illustrates the sensed current $I_{SENSE}$ results using the same load test as shown in FIG. 6. The room temperature line 710 (27 C) falls below the 85 C data line 712 which falls below the 125 C data line 714. During the first variable load pulse, shown in time span 702 corresponding to time span 602 in FIG. 6, the $I_{SENSE}$ current between the 3 different temperatures is hardly distinguishable. However, the sloping line from approximately 1.5 mA to 5 mA is consistent with the increasing load current and corresponds to the increasing voltage $V_{DS}$on seen in time span 602 of FIG. 6. Looking at time span 704, which corresponds to time span 604 from FIG. 6, the data lines separate with the room temperature data 710 being the lowest at approximately 5.0 mA and the high temperature at the highest level of approximately 5.2 mA. The $I_{SENSE}$ change due to temperature change is between 4% and 5% (which is a vast improvement to the 90% delta seen in $V_{DS}$on).

As can be seen by reviewing the graphs above, by utilizing the resistances of intrinsic circuit elements as in the novel arrangements of the present application, and in sharp contrast to the prior known approaches, no additional sensing resistors are required that reduce efficiency and which could introduce additional temperature dependence.

In another arrangement that forms an additional aspect of the present application, a different amplifier was used in simulation. Substituting a higher gain and slower op amp results in an $I_{SENSE}$ change of less than 0.1%. However, one skilled in the art will readily understand that a higher gain op amp takes longer to settle and results in a slower response time, thus limiting the frequency response to the load current. Various amplifiers can be used to implement the comparator amplifiers of the arrangements according to the needs of a particular application. Each of these alternative arrangement is contemplated by the inventors and forms an additional aspect of the present application.

Figure 8:
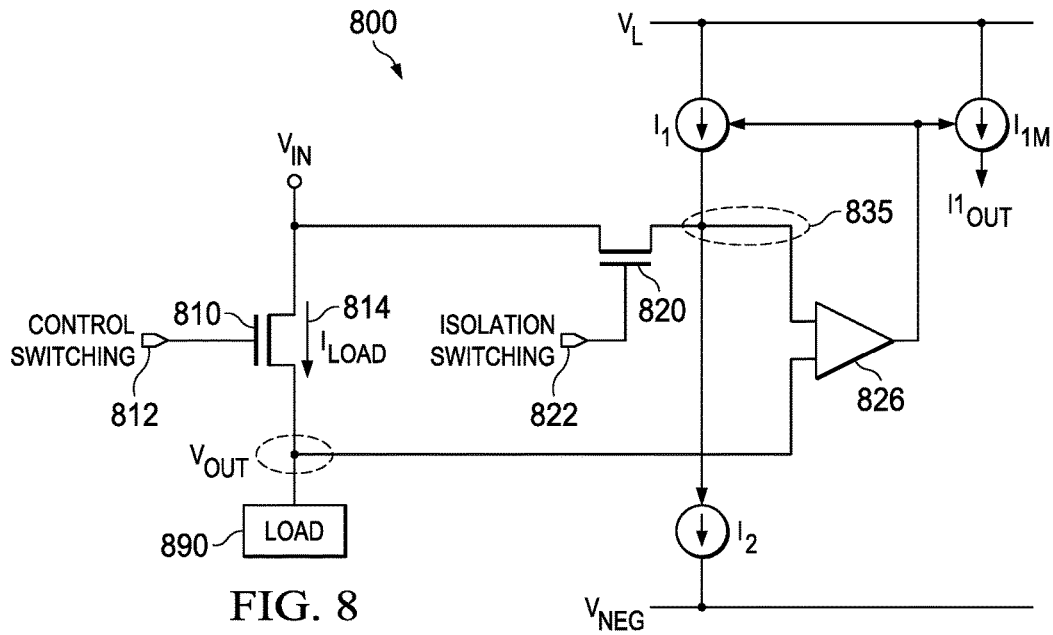
FIG. 8 is a circuit schematic that illustrates an alternative arrangement utilizing another aspect of the present application.

FIG. 8 illustrates in another circuit schematic a circuit 800 utilizing another aspect of the present application. In a system with a negative power supply available, a simplified circuit arrangement can be employed that requires only two FETs, the power FET and a single isolation FET. In FIG. 8, a power FET 810 is switched by Control Switching circuitry 812, shown as a circuit block. Those skilled in the art of FET switching will appreciate the various forms of construction and operation of the control/PWM switching circuitry without further detailed discussion. When switched on, power FET 810 is supplied by input voltage Vin and provides load current $I_{LOAD}$ 814 to the load 890 at an output voltage terminal Vout. Coupled to the source terminal of power FET 810 is an isolation transistor FET 820. The isolation FET is switched by the isolation switching circuitry 822, shown as a circuit block. At node 835, isolation FET 820 is coupled to current source $I_1$ which is supplied by a positive voltage supply $V_L$. An op amp 826 has its inputs coupled to node 835 and the output voltage terminal Vout. Vout is a node between the power FET 810 and the Load 890. A second current source $I_2$ is connected to node 835 and to a negative voltage supply terminal $V_{NEG}$. The output of the op amp 826 is coupled to the control line of current source $I_1$ and the mirror current source $I_{1M}$. In this arrangement, the second current source does not require a control terminal but provides a predetermined current I2 from the first node to the negative power supply.

In FIG. 8, in circuit 800, the power FET 810 and isolation FET 820 are assumed to be of the same transistor type and are formed and located on the same semiconductor substrate. In one arrangement, all of the circuit components of circuit 800 can be provided on a single integrated circuit. However, in alternative arrangements that are also contemplated by the inventors and which form additional aspects of the present application, the FETs 810 and 820 can be formed on an integrated circuit, while other components of circuit 800 can be formed on other integrated circuits or provided as discrete components. The co-location of the FETs 810, 820 on a common semiconductor substrate or layer normalizes processing variations as well as the thermal conditions that each of these components experiences. The input voltage Vin is assumed to exceed the breakdown voltage of the sense circuitry, so the isolation switching ensures that the isolation FET 820 is ON only when the power FET 810 is ON. Also, as another feature of the arrangements, the isolation switching can be used to turn off FET 820 when current sensing is not required, to save power. When the power FET 810 is on, the voltage across the power FET's drain-source current conduction path, $V_{DS}$on, is within the voltage tolerance of the sense circuitry. Those skilled in the art of FET switching will appreciate the various forms of construction and operation of the isolation switching circuitry without further detailed discussion.

Analyzing the voltage across the power FET 810 yields the following relationships:

$$(I_1-I_2) \times R_{ON}(820) = -V_{DS}\text{on}(810) \qquad \text{Equation 2}$$

$$V_{DS}\text{on}(810) = (I_2-I_1) \times R_{ON}(820) \qquad \text{Equation 2.1}$$

And for $I_1$, $I_2 \ll I_{LOAD}$: $V_{DS}\text{on}(810) = R_{DS}\text{on}(810) \times I_{LOAD}$, so we have:

$$R_{DS}\text{on}(810) \times I_{LOAD} = (I_2-I_1) \times R_{ON}(820)) \qquad \text{Equation 2.3}$$

Solving for the load current:

$$I_{LOAD} = (I_2-I_1) \times (R_{ON} \div R_{DS}\text{on}) \qquad \text{Equation 2.4}$$

Where the differential sense current $I_{SENSE} = (I_2-I_1)$, $$I_{LOAD} = I_{SENSE} \times (R_{ON} \div R_{DS}\text{on}) \qquad \text{Equation 2.5}$$

Which is the same relationship that results from circuit 500 in the prior arrangement.

With FETs 810 and 820 being the same type and co-located, the $R_{DS}$on change factor as shown in Equation 1.6 above for the two devices will be well matched across the temperature range. The term $(R_{ON} \div R_{DS}\text{on})$ therefore cancels out the temperature coefficients for the on resistances of the transistors and makes the estimate of the load current independent of temperature, and proportional to a difference in the currents $I_2$ and $I_1$. The current mirror $I_{1M}$ can be utilized by the designer to output I1. Since the current I2 in circuit 800 is known, the difference I1-I2 can be computed and can be used to calculate LOAD and use the $I_{LOAD}$ information as needed. A typical use would be to feedback the information to the Control/PWM Switching block 812 so as to limit the amount of load current to a value the power FET 810 can safely handle. However this is but one example and additional applications can also be formed and these alternatives form additional aspects of the present application.

Figure 9:
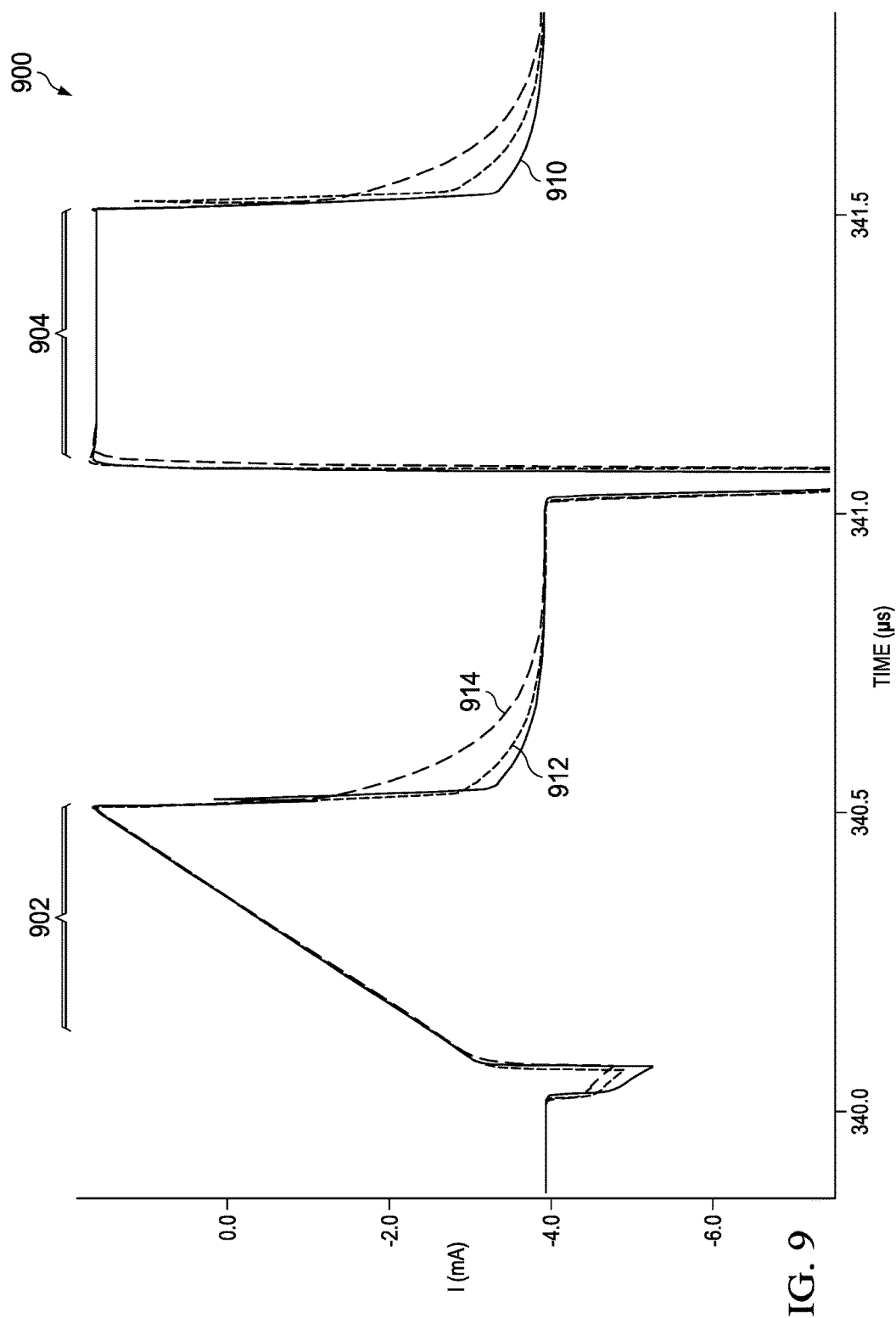
FIG. 9 is a graph of the load current estimate of a power FET operated using an example arrangement across a temperature range.

FIG. 9 is a graph of the load current estimate obtained using the novel arrangement of FIG. 8 for a power FET across a temperature range. Using the same test loads at the same test temperatures as shown in FIG. 6, FIG. 9 illustrates the stability of the sensed current ISENSE across the temperature range of the tests from 27 C to 125 C. In FIG. 9, graph 900 is shown with increasing current in milliamps on the vertical or Y axis and time on the horizontal or X axis, and illustrates the $I_{SENSE}$ measurement results of the load test shown in FIG. 6. The room temperature line 910 (27 C) falls below the 85 C data line 912 which falls below the 125 C data line 914. In this simulated test, a standard Op Amp with high open loop gain (OLG) of approximately 50,000 was used as the comparator amplifier. However the arrangements are not so limited, and this is but one example of an amplifier that can be used to form an arrangement. During the first variable load pulse, shown in time span 902 which corresponds to the time span 602 in FIG. 6, the current differential between the 3 temperatures is hardly distinguishable, except in the settling period following time span 902. However, the sloping line from approximately −4.0 mA to 1 mA is consistent with the increasing load and corresponds to the increasing voltage $V_{DS}$on seen in time span 602 of FIG. 6. Looking at time span 904, which corresponds to time span 604 from FIG. 6, the data lines again are nearly indistinguishable except in the settling period following time span 904. The $I_{SENSE}$ change due to temperature is less than 0.05% (which is a vast improvement to the 90% delta seen in $V_{DS}$on).

Graph 900 illustrates that by utilizing the resistances of intrinsic circuit elements as in the novel arrangements, the load current can be accurately sensed and no additional resistors are required that reduce efficiency and which could reintroduce additional temperature dependence.

Figure 10:
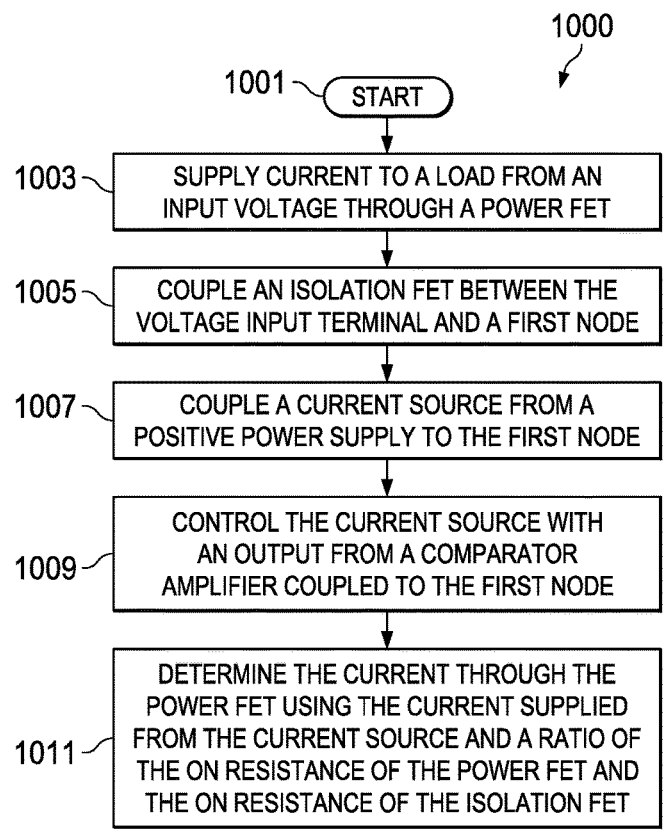
FIG. 10 is a flow diagram depicting a method arrangement forming an aspect of the present application.

FIG. 10 is a flow diagram illustrating a method arrangement 1000 for operating a power FET and sensing the load current. In the method arrangement, the method begins at step 1001. In step 1003, a power FET is switched on to supply current to a load from an input voltage. In step 1005, an isolation transistor is coupled between an input voltage and a first node. In step 1007, a first current source is coupled to the first node. In step 1009, a comparator amplifier is coupled to the first node and the output of the comparator is coupled to control the first current source. In step 1011, the comparator is operated to control the first current. In step 1013, the load current through the power FET can be determined using the first current and a ratio of the on resistance of the power FET and the on resistance of the first isolation transistor. Because the ratio is used, temperature dependence of the transistor is removed from the calculation.

Figure 11:
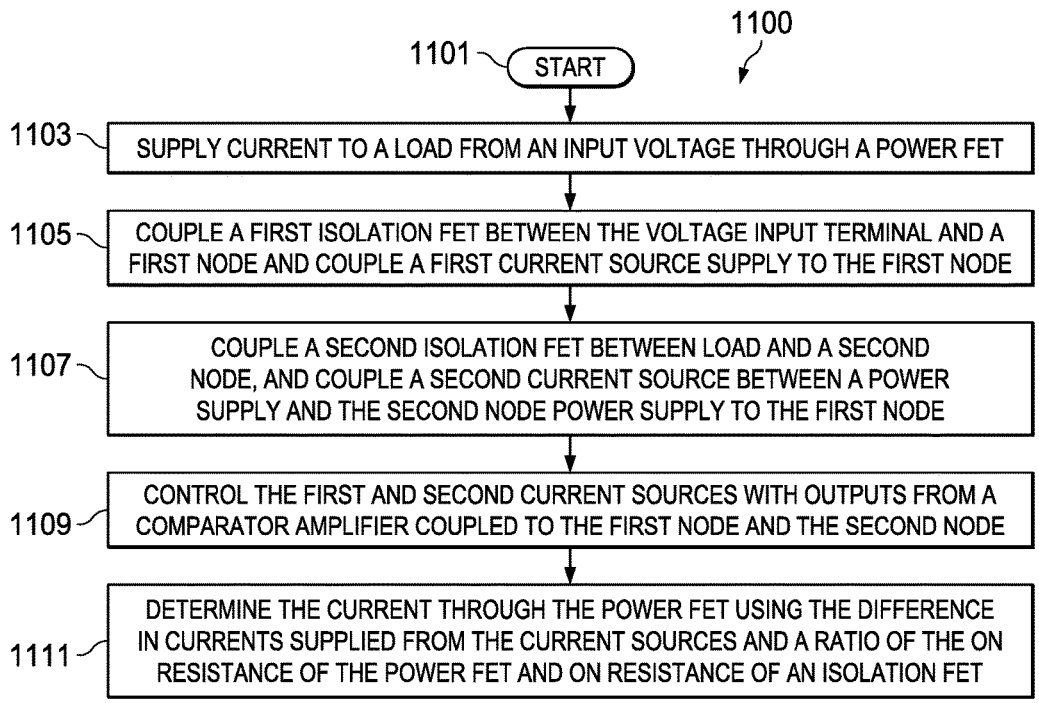
FIG. 11 is a second flow diagram depicting an alternative method arrangement forming another aspect of the present application.

FIG. 11 illustrates in a flow diagram the steps for an alternative method arrangement 1100. The method begins at block 1101, start. In step 1103, a power FET is coupled to supply current to a load from an input voltage. In step 1105, a first isolation transistor is coupled between the input voltage and the first node, and a first current source coupled between the power supply and the first node. In step 1107, a second isolation FET is coupled between the load and a second node, and a second current source is coupled between a power supply and the second node. In step 1109, the two current sources are controlled by the differential outputs form a comparator coupled to the first node and the second node. In step 1111, the current through the power FET is determined using the difference between the two currents and a ratio of the on resistance of the FET and the on resistance of one of the isolation FETs, as described above.

Figure 12:
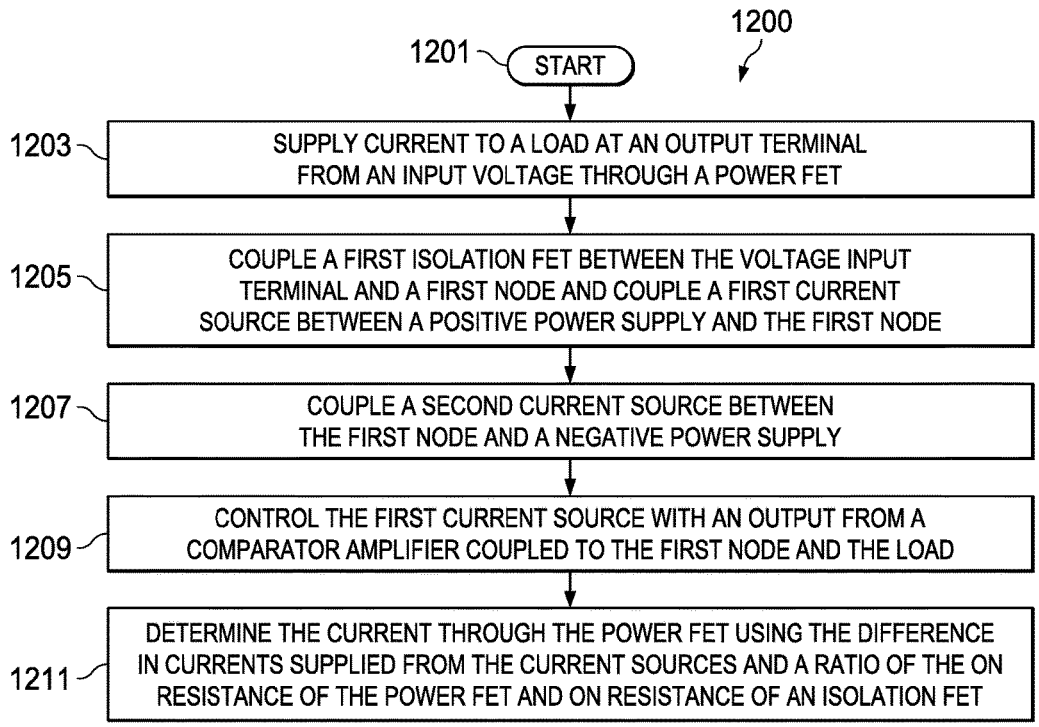
FIG. 12 is a third flow diagram depicting another alternative method arrangement forming an additional aspect of the present application.

FIG. 12 depicts still another method arrangement 1200. In this method a negative power supply is available. The method 1200 begins at step 1201, start. At step 1203, the power FET is coupled between an input voltage terminal and an output voltage terminal to supply current to a load at the output terminal. At step 1205, a first isolation FET is coupled between the input voltage and a first node, and a first current source is coupled between a positive power supply and the first node. In step 1207, a second current source is coupled between the first node and a negative voltage supply. At step 1209, a comparator amplifier is coupled to the first node and the output voltage terminal that supplies the load is coupled to the second differential input of the comparator amplifier. The power FET is switched on to supply current to a load. At step 1209 the comparator amplifier is operated to control the first current. At step 1211, the current through the power FET can be calculated using a difference between the first current and second current and a ratio of the on resistance of the power FET and the on resistance of the first isolation transistor, as is described above.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. An apparatus, comprising:
a power switch having a switch control input and having a current conduction path coupled between a voltage input and an output voltage terminal, configured for supplying current to a load responsive to a switch control signal coupled to the switch control input;
a first isolation switch having a current conduction path coupled between the voltage input a first node, and having a control terminal coupled to an isolation switching control circuit;
a comparator amplifier having a pair of differential inputs coupled to the first node and to a second node, and having at least one output, the comparator amplifier configured to output a voltage in response to the difference at the differential inputs;
a first current source coupled between a positive supply voltage and the first node, and configured to output a first current responsive to the voltage output from the comparator amplifier; and wherein the first current is proportional to the current through the power switch and to a ratio of the on resistance of the power switch and the on resistance of the first isolation switch;
further comprising:
a second isolation switch coupled between the output voltage terminal and the second node; and
a second current source coupled between the positive supply voltage and the second node.

2. The apparatus of claim 1, wherein the comparator amplifier further comprises a second output voltage and the second current source supplies a current to the second node responsive to the second output voltage.

3. The apparatus of claim 2, wherein a difference between the first current and the second current is proportional to a current supplied through the power switch.

4. The apparatus of claim 1, wherein the power switch, the first isolation switch and the second isolation switch each comprise a field effect transistor (FET) formed of a common semiconductor material.

5. The apparatus of claim 4, wherein the semiconductor material comprises gallium nitride.

6. The apparatus of claim 4, wherein the semiconductor material is one selected from the group consisting essentially of silicon, silicon carbide, gallium arsenide, gallium nitride, indium arsenide, germanium, and silicon germanium.

7. The apparatus of claim 1, wherein the power switch, the first isolation switch, and the second isolation switch, each comprise GaN FET devices.

8. The apparatus of claim 1, wherein the first isolation switch and the second isolation switch comprises transistors that are a same size.

9. An apparatus, comprising:
a power switch having a switch control input and having a current conduction path coupled between a voltage input and an output voltage terminal, configured for supplying current to a load responsive to a switch control signal coupled to the switch control input;
a first isolation switch having a current conduction path coupled between the voltage input a first node, and having a control terminal coupled to an isolation switching control circuit;
a comparator amplifier having a pair of differential inputs coupled to the first node and to a second node, and having at least one output, the comparator amplifier configured to output a voltage in response to the difference at the differential inputs;
a first current source coupled between a positive supply voltage and the first node, and configured to output a first current responsive to the voltage output from the comparator amplifier; and
wherein the first current is proportional to the current through the power switch and to a ratio of the on resistance of the power switch and the on resistance of the first isolation switch; and
a second current source coupled between the first node and a negative power supply and supplying a second current from the first node;
wherein the second node of the comparator amplifier is coupled to the output voltage terminal, and a difference between the first current and the second current is proportional to the current through the power switch.

10. The apparatus of claim 9, wherein the first current is proportional to the current through the power switch multiplied by a ratio of the on resistance of the power switch and the on resistance of the first isolation switch.

11. A method, comprising:
coupling a current conduction path of a power switch between an input voltage terminal and an output voltage terminal for supplying current to a load at the output voltage terminal, responsive to a switching control circuit;
coupling a current conduction path of a first isolation switch between the input voltage terminal and a first node, and coupling a first current source between a positive voltage power supply and the first node, the first current source having a control input;
coupling a comparator amplifier to the first node and to a second node, and coupling the output of the comparator amplifier to the control input of the first current source;
operating the power switch to supply current to a load coupled to the voltage output terminal;
operating the comparator to control the first current from the first current source; and
using the first current, computing a load current through the power switch, where the first current is proportional to the load current through the power switch and a ratio of an on resistance of the power switch and an on resistance of the first isolation switch;
further comprising:
coupling a second isolation switch between the voltage output terminal and the second node, and coupling a second current source between the positive voltage supply and the second node;
coupling a second output of the comparator amplifier to control a second current supplied by the second current source to the second node;
operating the power switch to supply current to a load coupled to the voltage output terminal;
operating the comparator to control the first current and the second current; and
computing a load current through the power switch by determining a difference between the first current and the second current.

12. The method of claim 11, wherein the power switch and the first isolation switch are FET devices formed on a common semiconductor substrate.

13. A method, comprising:
coupling a current conduction path of a power switch between an input voltage terminal and an output voltage terminal for supplying current to a load at the output voltage terminal, responsive to a switching control circuit;
coupling a current conduction path of a first isolation switch between the input voltage terminal and a first node, and coupling a first current source between a positive voltage power supply and the first node, the first current source having a control input;
coupling a comparator amplifier to the first node and to a second node, and coupling the output of the comparator amplifier to the control input of the first current source;
operating the power switch to supply current to a load coupled to the voltage output terminal;
operating the comparator to control the first current from the first current source; and
using the first current, computing a load current through the power switch, where the first current is proportional to the load current through the power switch and a ratio of an on resistance of the power switch and an on resistance of the first isolation switch;
further comprising:
coupling a second current source to the first node to supply a second current from the first node to a negative voltage supply;

coupling the output voltage terminal to the second node;
operating the power switch to supply current to a load coupled to the output voltage terminal;
operating the comparator to control the first current; and
computing a load current through the power switch by determining a difference between the first current and the second current and multiplying the difference by a ratio of the on resistance of the power switch and the on resistance of the first isolation switch.

14. The method of claim 12, wherein the common semiconductor substrate is formed from one selected from the group consisting essentially of silicon, silicon carbide, silicon germanium, germanium, gallium, gallium nitride, and gallium arsenide.

15. An integrated circuit, comprising:
a semiconductor substrate;
a power FET formed on the semiconductor substrate and having an input voltage terminal, a gate terminal coupled to a switch control circuit, and an output voltage terminal, the power FET configured to supply current to a load at the voltage output terminal;
a first isolation FET formed on the semiconductor substrate and coupled between the input voltage terminal and a first node, and having a gate terminal coupled to an isolation control circuit;
a comparator amplifier having a first differential input coupled to the first node and a second differential input, and configured to output a voltage corresponding to a difference between the voltages at the first differential input and the second differential input; and
a first current source coupled between a positive voltage supply and the first node, configured to output a current responsive to the output voltage from the comparator amplifier;
wherein the current output from the first current source is proportional to the current through the power FET and a ratio of an on resistance of the power FET and an on resistance of the first isolation FET;
further comprising:
a second isolation FET formed on the semiconductor substrate and coupled between the output voltage terminal and a second node; and
a second current source coupled between the positive voltage supply and the second node to supply a second current to the second node;
the second node coupled to the second differential input, and the comparator having a second output controlling the second current source;
wherein a difference between the first current and the second current is proportional to the current through the power switch multiplied by a ratio of the on resistance of the power FET and an on resistance of the first isolation FET.

16. The integrated circuit of claim 15 wherein the semiconductor substrate is one selected from the group consisting essentially of silicon, silicon carbide, germanium, gallium arsenide, silicon germanium, and gallium nitride.

17. An integrated circuit, comprising:
a semiconductor substrate;
a power FET formed on the semiconductor substrate and having an input voltage terminal, a gate terminal coupled to a switch control circuit, and an output voltage terminal, the power FET configured to supply current to a load at the voltage output terminal;
a first isolation FET formed on the semiconductor substrate and coupled between the input voltage terminal and a first node, and having a gate terminal coupled to an isolation control circuit;
a comparator amplifier having a first differential input coupled to the first node and a second differential input, and configured to output a voltage corresponding to a difference between the voltages at the first differential input and the second differential input; and
a first current source coupled between a positive voltage supply and the first node, configured to output a current responsive to the output voltage from the comparator amplifier;
wherein the current output from the first current source is proportional to the current through the power FET and a ratio of an on resistance of the power FET and an on resistance of the first isolation FET;
further comprising:
a second current source coupled between the first node and a negative voltage supply and configured to supply a second current from the first node to the negative voltage supply; and
the second differential input is coupled to the output voltage terminal;
wherein a the difference between the first current and the second current is proportional to the current through the power FET multiplied by a ratio of the on resistance of the power FET to an on resistance of the first isolation FET.

* * * * *